(12) United States Patent
Usami et al.

(10) Patent No.: US 8,749,058 B2
(45) Date of Patent: Jun. 10, 2014

(54) SEMICONDUCTOR DEVICE AND MANUFACTURING METHOD THEREOF

(75) Inventors: Tatsuya Usami, Kanagawa (JP); Hideaki Tsuchiya, Kanagawa (JP); Yukio Miura, Kanagawa (JP); Tomoyuki Nakamura, Kanagawa (JP); Koichi Ohto, Kanagawa (JP); Chikako Ohto, Kanagawa (JP); Shinji Yokogawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/324,925

(22) Filed: Dec. 13, 2011

(65) Prior Publication Data

US 2012/0181694 A1     Jul. 19, 2012

(30) Foreign Application Priority Data

Jan. 14, 2011   (JP) ................. 2011-005834

(51) Int. Cl.
*H01L 29/72*    (2006.01)

(52) U.S. Cl.
USPC .... 257/751; 257/639; 257/762; 257/E21.575; 257/E23.155; 427/569; 428/220; 438/618

(58) Field of Classification Search
USPC .......... 257/639, 751, 762, E21.575, E23.155
See application file for complete search history.

(56) References Cited

U.S. PATENT DOCUMENTS

| | | | | |
|---|---|---|---|---|
| 5,582,880 | A * | 12/1996 | Mochizuki et al. | 427/569 |
| 6,774,462 | B2 * | 8/2004 | Tanaka et al. | 257/639 |
| 2003/0183939 | A1 * | 10/2003 | Kakamu et al. | 257/762 |
| 2011/0064932 | A1 * | 3/2011 | Takahashi et al. | 428/220 |

FOREIGN PATENT DOCUMENTS

JP     2009-182000 A     8/2009

* cited by examiner

*Primary Examiner* — Edward Wojciechowicz

(74) *Attorney, Agent, or Firm* — McGinn IP Law Group, PLLC

(57) ABSTRACT

The semiconductor device includes an interlayer insulating film, a wiring provided in the interlayer insulating film, and a SiN film provided over the interlayer insulating film and over the wiring. The peak positions of Si—N bonds of the SiN film, which are measured by FTIR, are within the range of 845 $cm^{-1}$ to 860 $cm^{-1}$. This makes it possible to inhibit current leakage in a silicon nitride film, which is a barrier insulating film for preventing the diffusion of wiring metal.

32 Claims, 12 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2011-5834 filed on Jan. 14, 2011 including the specification, drawings, and abstract is incorporated herein by reference in its entirety.

BACKGROUND

The present invention relates to a semiconductor device and a semiconductor device manufacturing method.

As wiring is increasingly miniaturized, it is demanded that an effective dielectric constant be decreased. Particularly, the dielectric constant of a barrier insulating film for preventing the diffusion of wiring metal is relatively high. It is therefore demanded that the dielectric constant of the barrier insulating film be decreased. Studies have been conducted to decrease the dielectric constant of the barrier insulating film, for instance, by using a barrier insulating film made of a substance having a high organic component content such as C-rich SIGN, C-rich SIC, or C-rich SiCO. Meanwhile, the barrier insulating film can be thinned as described in Japanese Patent Application Publication No. 2009-182000.

The technology described in Japanese Patent Application Publication No. 2009-182000 prepares a barrier insulating film having a laminated structure in such a manner that it partially includes a high-density film, which has a high film density. It is also disclosed that the barrier insulating film having a laminated structure partially includes a silicon nitride film. Japanese Patent Application Publication No. 2009-182000 states that the use of the above barrier insulating film, which is thinned and configured to prevent the permeation of extraneous water, decreases the effective dielectric constant.

According to Japanese Patent Application Publication No. 2009-182000, the barrier insulating film includes the silicon nitride film, which provides high resistance to water permeability. This makes it possible to prevent the permeation of water without increasing the thickness of the barrier insulating film. Hence, Japanese Patent Application Publication No. 2009-182000 states that the effective dielectric constant can be decreased while preventing the permeation of extraneous water. However, the inventors of the present invention have found that considerable current leakage occurs in the silicon nitride film included in the barrier insulating film. Consequently, a semiconductor device with a highly reliable barrier insulating film having a low effective dielectric constant is demanded.

According to one aspect of the present invention, there is provided a semiconductor device including an interlayer insulating film, wiring laid in the interlayer insulating film, and a Si-and-N contained insulating film formed over the interlayer insulating film and over the wiring. The peak positions of Si—N bonds of the SiN film, which are measured by FTIR (Fourier transform infrared spectroscopy), are within the range of 845 cm$^{-1}$ to 860 cm$^{-1}$.

The inventors of the present invention have found that there is current leakage in the silicon nitride film included in the barrier insulating film due to Si—H bonds and dangling bonds possessed by the silicon nitride film. According to an embodiment of the present invention, the peak positions of Si—H bonds of the SiN film, which are measured by FTIR, are within the range of 845 cm$^{-1}$ to 860 cm$^{-1}$. It indicates that the Si—H bonds and dangling bonds are decreased in number. As described above, the SiN film according to an embodiment of the present invention is such that the Si—H bonds and dangling bonds are decreased in number. Therefore, the current leakage in the silicon nitride film can be inhibited. This makes it possible to provide a semiconductor device with a highly reliable barrier insulating film having a low effective dielectric constant.

According to another aspect of the present invention, there is provided a semiconductor device including a first interlayer insulating film, wiring laid in the first interlayer insulating film, and a Si-and-N-contained insulating film formed over the first interlayer insulating film and over the wiring. The composition ratio of N/Si in the Si-and-N-contained insulating film, which is measured by XPS (X-ray photoemission spectroscopy), is within the range of 0.9 to 4/3.

According to still another aspect of the present invention, there is provided a semiconductor device including a first interlayer insulating film, wiring laid in the first interlayer insulating film, and a Si-and-N-contained insulating film formed over the first interlayer insulating film and over the wiring. The spin density due to dangling bonds in the Si-and-N-contained insulating film is not higher than 1E17 spins/cm$^3$.

According to yet another aspect of the present invention, there is provided a semiconductor device manufacturing method including the steps of: laying wiring in an interlayer insulating film, forming a N-contained insulating film over the interlayer insulating film and over the wiring, and performing an enhanced nitridation process on the N-contained insulating film.

The present invention makes it possible to provide a semiconductor device with a highly reliable barrier insulating film having a low effective dielectric constant.

BRIEF DESCRIPTION OF THE DRAWINGS

Embodiments of the present invention will be described in detail based on the following figures, in which.

DETAILED DESCRIPTION

Figure 1:
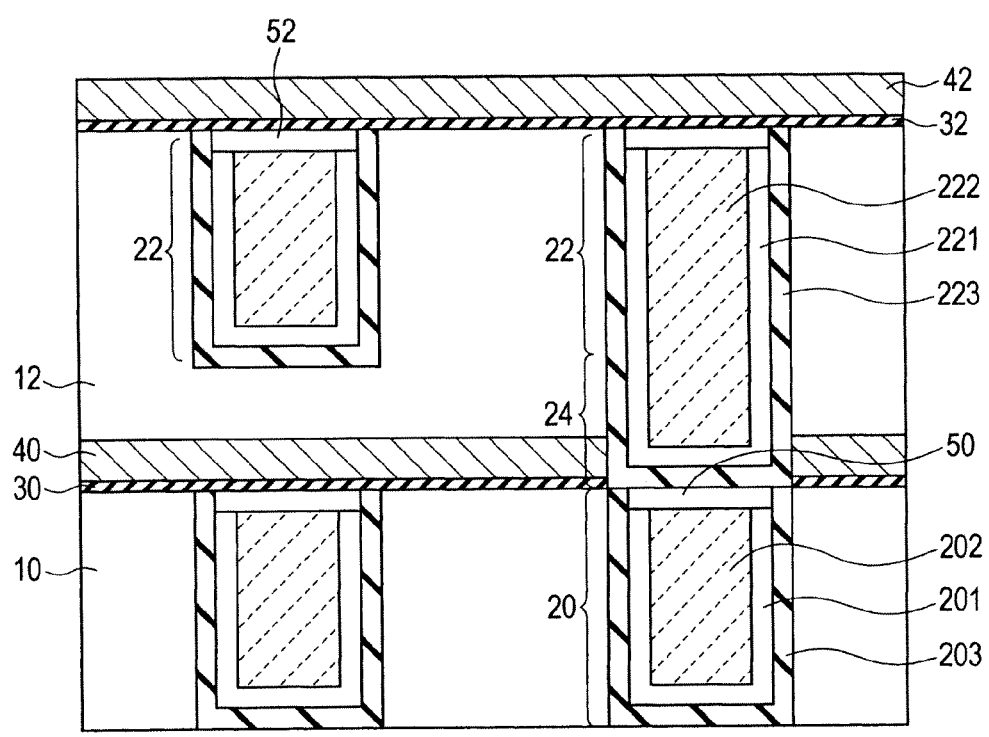
FIG. 1 is a cross-sectional view illustrating a semiconductor device according to an embodiment of the present invention.

Preferred embodiments of the present invention will now be described with reference to the accompanying drawings. Like elements in the drawings are designated by the same reference numerals and will not be redundantly described.

Figure 9:
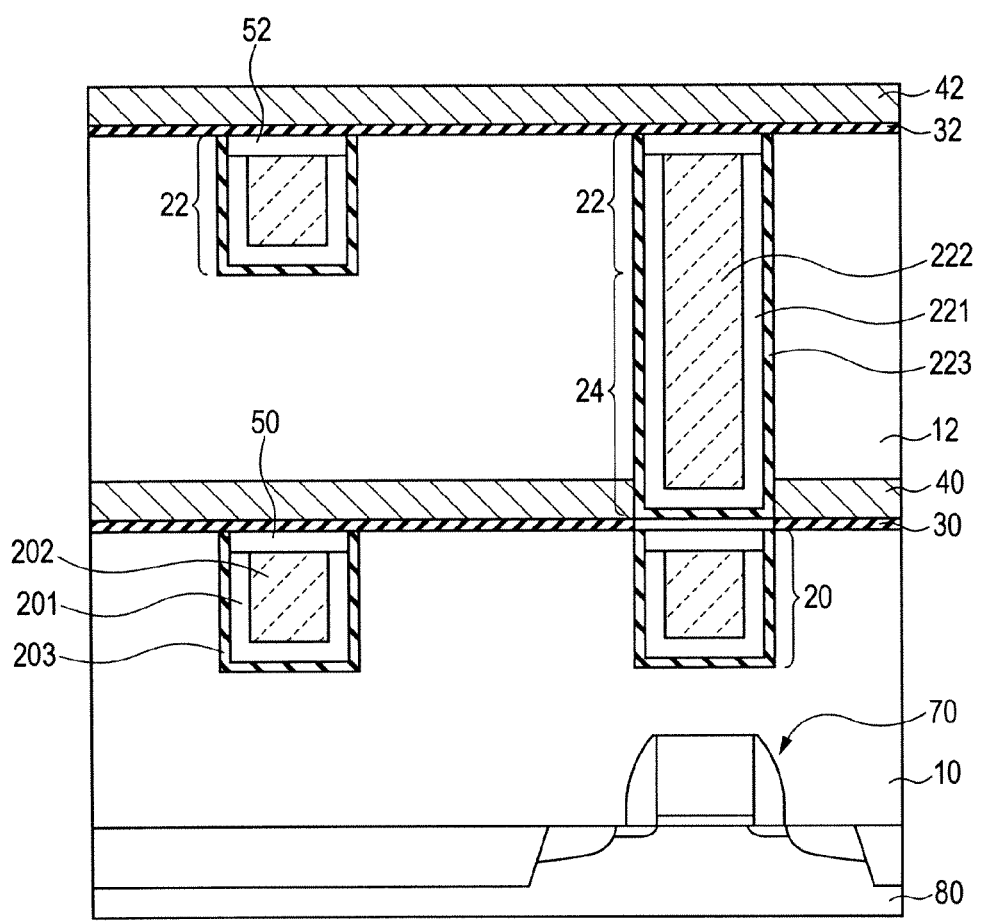
FIG. 9 is a cross-sectional view illustrating a case where a multilayer wiring structure shown in FIG. 1 is formed over a substrate.

FIG. 1 is a cross-sectional view illustrating a semiconductor device 100 according to an embodiment of the present invention. FIG. 9 is a cross-sectional view illustrating a case where a multilayer wiring structure shown in FIG. 1 is formed over a substrate. The semiconductor device 100 includes an interlayer insulating film 10, wiring 20, and a SiN film 30. The peak positions of Si—N bonds of the SiN film, which are measured by FTIR, are within the range of 845 $cm^{-1}$ to 860 $cm^{-1}$. The wiring 20 is laid in the interlayer insulating film 10. The SiN film 30 is formed over the interlayer insulating film 10 and over the wiring 20. The configuration of the semiconductor device 100 will be described in detail below.

As shown in FIG. 9, the semiconductor device 100 includes a silicon substrate 80, which is provided with a transistor 70, and multilayer wiring, which is laid over the silicon substrate 80. The interlayer insulating film 10, which is included in the multilayer wiring, is formed over the silicon substrate 80. The interlayer insulating film 10 is a low-k film that is made, for instance, of SiCOH, porous SiCOH, HSQ, porous HSQ, MSQ, porous MSQ, organic polymer, or porous organic polymer. The interlayer insulating film 10 has a thickness, for instance, of 100 to 180 nm.

As shown in FIG. 1, the wiring 20 includes a seed film 201, a plating film 202, and a barrier metal film 203, which are formed within an opening in the interlayer insulating film 10. The barrier metal film 203 is formed within the opening in the interlayer insulating film 10 by stacking a TaN film and a Ta film in sequence. The TaN film has a thickness, for instance, of 2 to 6 nm. The Ta film has a thickness, for instance, of 2 to 6 nm. The barrier metal film 203 may be formed by a monolayer film made, for instance, of Ta, Ti, or Co, or by a film stack having Ta, Ti, and Co films.

The seed film 201 includes, for instance, Cu and added metal such as Al, Mn, Ti, Sn, Mg, Si, or Zr. In this instance, the seed film 201 contains, for instance, 0.1 to 1 atomic percent of added metal. When Mn is used as the added metal, it provides higher wiring reliability than when Al is used, although it exhibits a low resistance increase rate. The seed film 201 may be made of pure Cu. The plating film 202 is formed by a plating method that uses the seed film 201 as a seed, and made, for instance, of Cu plating. Moreover, as shown in FIG. 1, if the wiring 20 is formed by an alloy containing the added metal, the wiring 20 further includes an added metal segregation layer 50 that is obtained when the added metal is segregated in a plane in contact with the SiN film 30.

The SiN film 30 functions as a barrier insulating film that prevents the diffusion of metal materials included in the wiring 20. It is preferred that the SiN film 30 have a thickness of 1 to 4 nm. If the thickness of the SiN film 30 exceeds 5 nm, nitridation plasma, for example, cannot fully reach into the film during a later-described enhanced nitridation process. As this increases the number of Si—H bonds and dangling bonds in the film, the obtained SiN film does not have a good quality.

The peak positions of Si—N bonds of the SiN film 30, which are measured by FTIR, are within the range of 845 $cm^{-1}$ to 860 $cm^{-1}$. The composition ratio of N/Si in the SiN film 30 is $0.9 \leq N/Si \leq 4/3$. These indicate that the Si—H bonds and dangling bonds in the SiN film 30 are small in number. It is preferred that the composition ratio of N/Si in the SiN film be $N/Si \geq 1$. If $N/Si \geq 1$, the amount of current leakage in the SiN film can be sufficiently reduced.

As shown in FIG. 1, the semiconductor device 100 further includes an etching stopper film 40, which is formed over the SiN film 30, and an interlayer insulating film 12, which is formed over the etching stopper film 40. Under conditions where the interlayer insulating film 12 is etched, the etching stopper film 40 exhibits a lower etching rate than the interlayer insulating film 12. Hence, the etching stopper film 40 functions as an etching stopper in a process of etching the interlayer insulating film 12. The etching stopper film 40 is a low-k film that includes, for example, at least one of SiCN (SiCNH), SiCO (SiCOH), SiCNO (SiCNOH), SiC (SiCH), SIB (SiBH), SiBN (SiBHN), SiBC (SiBCH), SiBCN (SiBCNH), C-rich SiCN (SiCNH), C-rich SiCO (SiCOH), C-rich SiCNO (SiCNOH), C-rich SiC (SiCH), C-rich SiBC (SiBCH), and C-rich SiBCN (SiBCHN). The low-k film is a film having a lower dielectric constant than $SiO_2$. The etching stopper film 40 has a relative dielectric constant, for instance, of 4 or less. The etching stopper film 40 has a thickness, for instance, of 20 to 50 nm.

The interlayer insulating film 12 can be made of the same material as the interlayer insulating film 10. The interlayer insulating film 12 has a thickness, for instance, of 150 to 200 nm. As shown in FIG. 1, the interlayer insulating film 12 includes wiring 22 and a via 24. As is the case with the wiring 20, the wiring 22 and the via 24 include a seed film 221, a plating film 222, and a barrier metal film 223. The via 24 is coupled to the wiring 20 through the SiN film 30 and the etching stopper film 40. The wiring 22 is coupled to the wiring 20 by way of the via 24. The seed film 221 may be made of the same material as the seed film 201. Further, the plating film 222 may be made of the same material as the plating film 202. A SiN film 32 and an etching stopper film 42 are stacked, in the order named, over the interlayer insulating film 12 and over the wiring 22. The etching stopper film 42 may be made of the same material as the etching stopper film 40. If the wiring 22 is formed by an alloy containing the added metal, the wiring 22 includes an added metal segregation layer 52 that is obtained when the added metal is segregated in a plane in contact with the SiN film 32.

A method of manufacturing the semiconductor device 100 will now be described. The method of manufacturing the semiconductor device 100 includes the step of laying the wiring 20 in the interlayer insulating film 10, the step of forming the SiN film 30 over the interlayer insulating film 10 and over the wiring 20, and the step of performing an enhanced nitridation process on the SiN film 30. The method of manufacturing the semiconductor device 100 will be described in detail below with reference to FIGS. 1 to 9.

Figure 2:
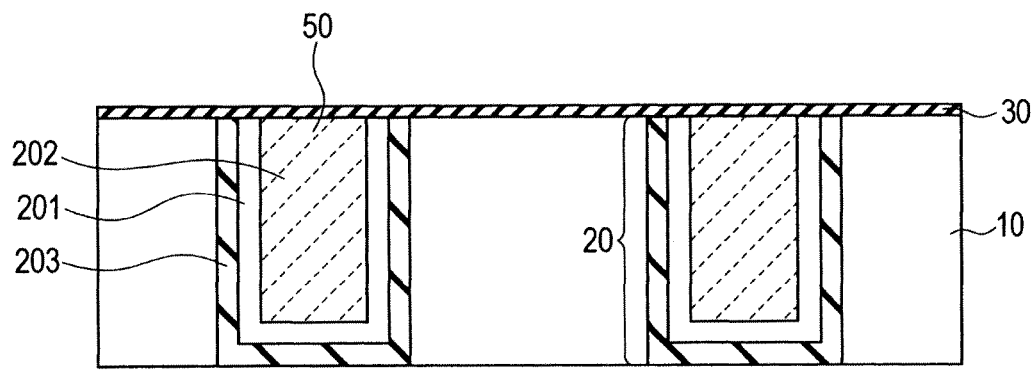
FIG. 2 is a cross-sectional view illustrating a method of manufacturing the semiconductor device shown in FIG. 1.

FIGS. 2 to 8 are cross-sectional views illustrating the method of manufacturing the semiconductor device 100 shown in FIG. 1. First of all, the interlayer insulating film 10 is formed over the silicon substrate 80 having the transistor 70 (see FIG. 9) as shown in FIG. 2. Next, the interlayer insulating film 10 is etched to form an opening for forming the wiring 20. The barrier metal film 203 is then formed over the bottom and side surfaces of the opening. Next, the seed film 201 is formed over the barrier metal film 203. The seed film is formed, for instance, by adding 0.1 to 1 atomic percent of Al to Cu and coating the barrier metal film 203 with the resulting substance by sputtering. Next, the plating film 202 is formed by a plating method that uses the seed film 201 as a seed. The surface of the wiring 20 is then planarized by CMP (chemical mechanical polishing) to finish the wiring 20. The wiring 20 is formed, for instance, by a dual damascene method.

Next, the SiN film 30 is formed over the interlayer insulating film 10 and over the wiring 20. The SiN film 30 is formed by a plasma CVD method that uses $SiH_4$ gas and $NH_3$ gas. For example, the SiN film 30 is formed by a parallel-plate plasma CVD method under conditions where the temperature is 300 to 370° C., the $SiH_4$ gas flow rate is 50 to 700 sccm, the $N_2$ gas flow rate is 0 to 40,000 ccm, the $NH_3$ gas flow rate is 50 to 700 sccm, the RF frequency is 13.56 MHz, the RF power is 50 to 250 W, the pressure is 1 to 5 torr, and the time is 1 to 10 s.

Figure 3:
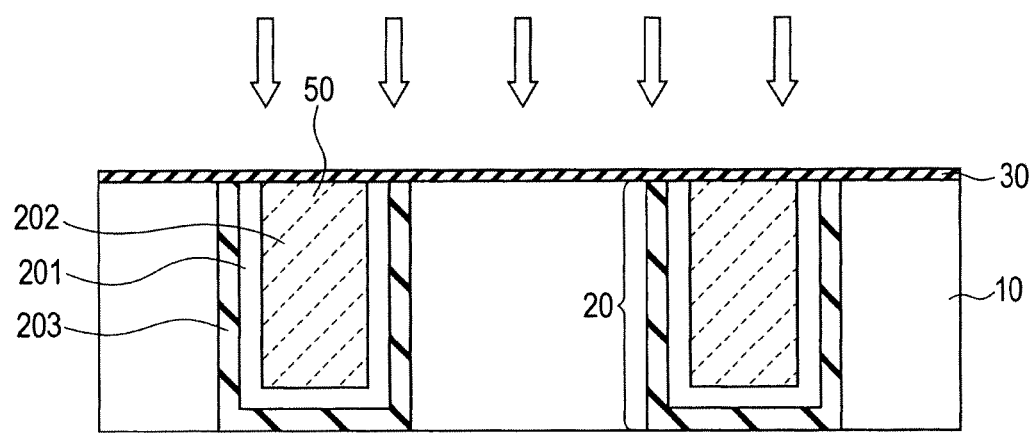
FIG. 3 is a cross-sectional view illustrating a method of manufacturing the semiconductor device shown in FIG. 1.

Next, the enhanced nitridation process is performed on the SiN film 30. As shown in FIG. 3, the enhanced nitridation process is a nitridation plasma process in which at least either $N_2$ or $NH_3$ is used to perform plasma CVD. The nitridation plasma process is performed, for instance, by the parallel-plate plasma CVD method under conditions where the temperature is 300 to 370° C., the $N_2$ gas flow rate is 0 to 50,000 ccm, the $NH_3$ gas flow rate is 300 to 1500 sccm, the RF frequency is 13.56 MHz, the RF power is 250 to 1000 W, the pressure is 1 to 5 torr, and the time is 5 to 30 s.

The power for plasma CVD in the nitridation plasma process shown in FIG. 3 is higher than the power for plasma CVD in a process of forming the SiN film 30. This makes it possible to form the SiN film 30 whose Si—H bonds and dangling bonds are small in number. The enhanced nitridation process may be carried out by performing an EB process or a UV process in a nitrogen-containing gas atmosphere.

The peaks of Si—N bonds in the SiN film subjected to the enhanced nitridation process, which are measured by FTIR, are larger in number than those in the SiN film that is not subjected to the enhanced nitridation process. It means that the Si—H bonds and dangling bonds are decreased in number. The peaks of Si—N bonds in the SiN film subjected to the enhanced nitridation process are within the range of 845 $cm^{-1}$ to 860 $cm^{-1}$. It is also verified that the peak positions of Si—H bonds are smaller in number than in a case where the enhanced nitridation process is not performed. FTIR analysis was performed under the following conditions with a 100 nm SiN film formed over a Si substrate. The SiN film was prepared by forming a stack of 33 layers of 3 nm thick film. The employed measuring instrument was Biorad's FTS40. Measurements were made at room temperature. Peaks within the range of 4000 $cm^{-1}$ to 400 $cm^{-1}$ were measured. Six scans were performed. A Si signal in the background was eliminated.

The composition ratio of N/Si in the SiN film 30 subjected to the enhanced nitridation process, which is measured by XPS, is 0.9≤N/Si≤4/3. To obtain a SiN film that has no dangling bond and is free from current leakage, it is preferred that N/Si≥1.0. XPS analysis was performed under the following conditions with a SiN film formed over a Si substrate as is the case with the FTIR analysis. The employed measuring instrument was Quantam 2000. Measurements were made by a depth profile method. Ar was used as a sputter gas. The employed sputter rate was 8.3 nm/min. An average value excluding the topmost surface was calculated. Si, N, and O were analyzed to calculate the ratio of N/Si. As for those related to periods before and after a PCT described in connection with a later-described embodiment, a depth profile around oxygen 1s was presented.

A decrease in the number of dangling bonds, which is brought about by the enhanced nitridation process, can also be verified by spin density that is measured by an ESR (electron spin resonance) method. Dangling-bond-induced spin density prevailing after the SiN film 30 is subjected to the enhanced nitridation process is not higher than 1E17 spins/$cm^3$. This value is not higher than the limit of detection by the ESR method. ESR analysis was performed under the following conditions with a SiN film formed over a Si substrate as is the case with the FTIR analysis. The employed measuring instrument was Bruker's ESP350E. Measurements were made with the plane of a specimen positioned perpendicularly to the direction of external magnetic field. ESR spectroscopic measurements were made at a temperature of 10 K. The central magnetic field was in the vicinity of 3368 G. The magnetic sweep range was 100 G. The spin density was calculated from a dangling-bond-induced signal of the SiN film in the vicinity of a G value of 2.004.

After the SiN film 30 is subjected to the enhanced nitridation process, nitrogen concentration is high in the upper surface of the SiN film 30 and decreases with a decrease in the distance to the lower surface. In the enhanced nitridation process, the SiN film 30 functions as a buffer. In the interlayer insulating film 10, therefore, nitrogen is segregated in an upper layer. This not only prevents the interlayer insulating film 10 from being excessively nitrided to increase the dielectric constant, but also improves TDDB (time-dependent dielectric breakdown) characteristics. Further, nitrogen is also segregated in an upper layer of the wiring 20. This prevents the surface of the wiring 20 from being oxidized. In addition, hydrogen in the SiN film 30 is segregated in the vicinity of the boundary between the wiring 20 and the barrier metal film 203 due to the nitridation plasma process. The reason is that the nitridation plasma process cuts the Si—H bonds in the SiN film 30 to let the hydrogen diffuse in a lower layer of the SiN film 30. Moreover, it is conceivable that the hydrogen will diffuse to the vicinity of the boundary between the wiring 20 and the barrier metal film 203 because the hydrogen is a lighter element and has smaller molecules than nitrogen.

Figure 4:
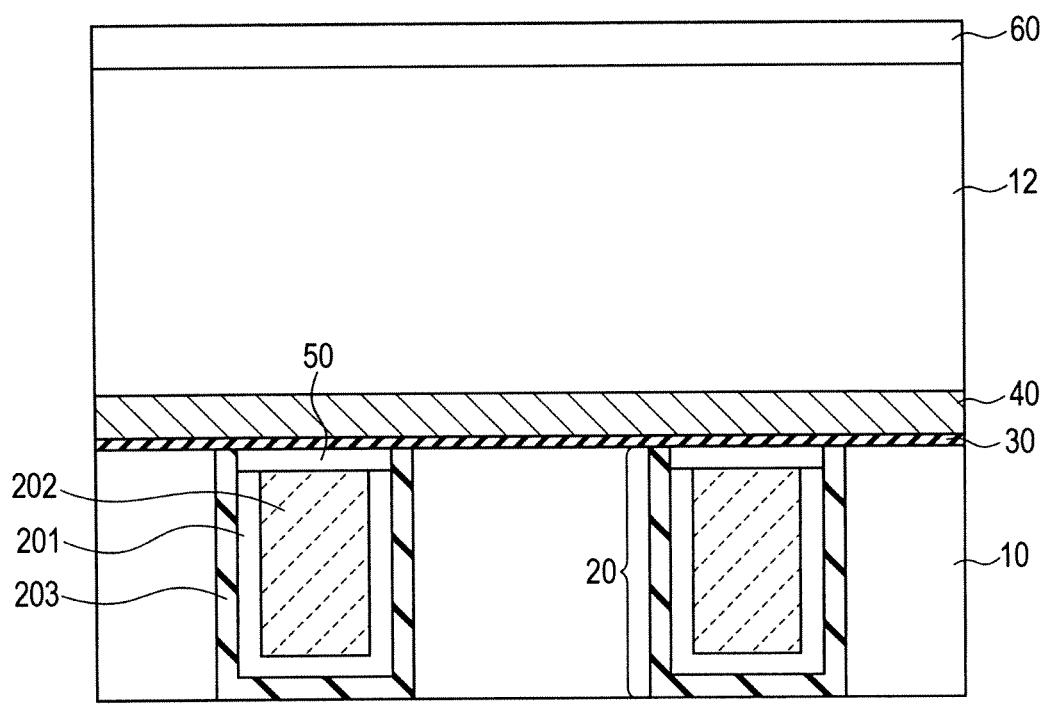
FIG. 4 is a cross-sectional view illustrating the method of manufacturing the semiconductor device shown in FIG. 1.

Next, the etching stopper film 40 is formed over the SiN film 30 as shown in FIG. 4. The interlayer insulating film 12 is then formed over the etching stopper film 40. In addition, a hard mask 60 is formed over the interlayer insulating film 12. The hard mask 60 is made, for instance, of $SiO_2$. In manufacturing processes shown in FIGS. 2 to 4, a thermal history of 350 to 400° C. is applied to the wiring 20. Therefore, if the wiring 20 is formed by an alloy containing the added metal, the added metal is segregated in the upper surface of the wiring 20 to form the added metal segregation layer 50.

Figure 5:
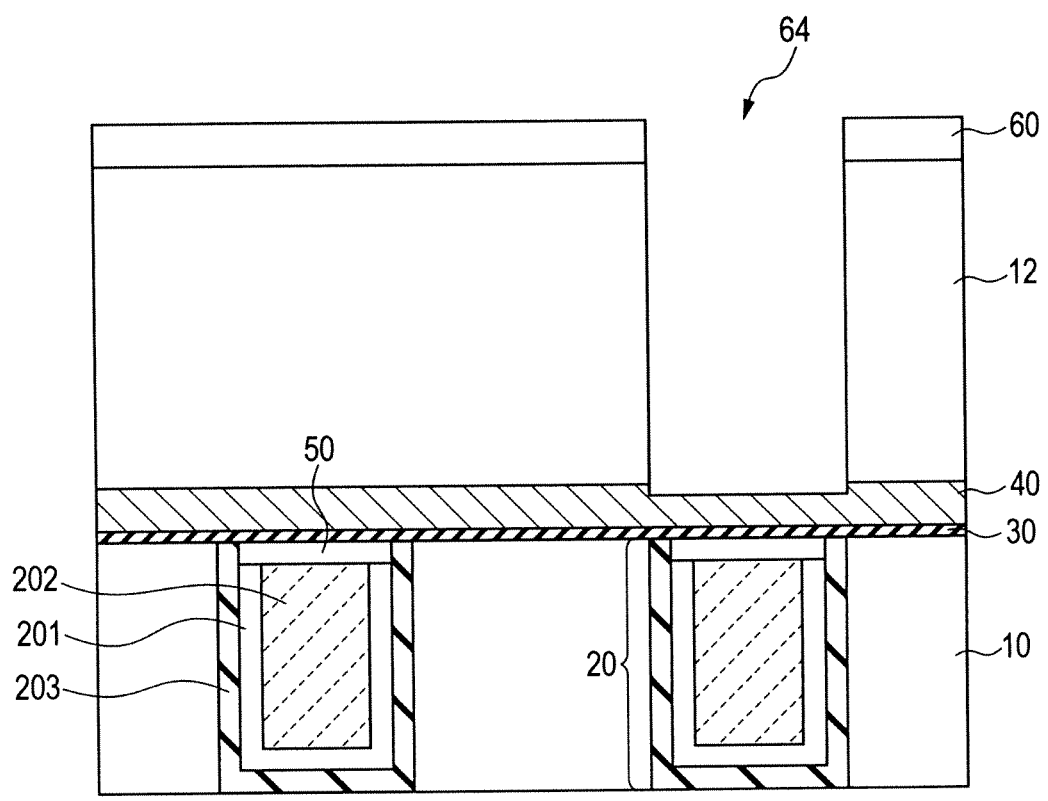
FIG. 5 is a cross-sectional view illustrating the method of manufacturing the semiconductor device shown in FIG. 1.

Next, as shown in FIG. 5, etching is performed to form an opening 64 in the interlayer insulating film 12 by using the hard mask 60 as a mask. In this instance, etching is stopped by the etching stopper film 40. The performance of the etching stopper film 40 is required to have an etching selection ratio of 10 or higher relative to the interlayer insulating film 12. If, for instance, the etching stopper film 40 is made of C-rich SiCN (O) and the interlayer insulating film 12 is made of SiCOH, the etching selection ratio of the etching stopper film 40 relative to the interlayer insulating film 12 is 20 or higher. If the etching stopper film 40 is made of C-rich SiCN(O) and the interlayer insulating film 12 is made of porous SiCOH, the etching selection ratio relative to the interlayer insulating film 12 is 30 or higher. The SiN film 30 positioned below the etching stopper film 40 exhibits good barrier performance. Therefore, the etching stopper film 40 does not have to exhibit good barrier performance and is acceptable as far as an appropriate etching selection ratio is obtained relative to the interlayer insulating film 12. Hence, the etching stopper film 40 having a relative dielectric constant of 4 or less may be used.

Figure 6:
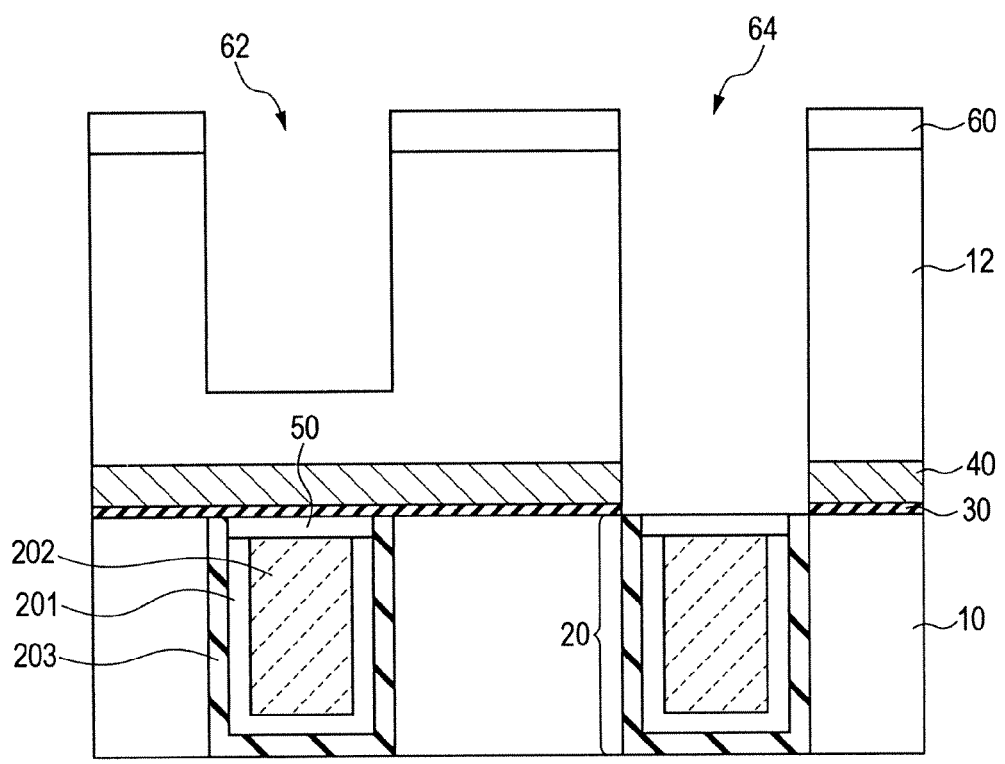
FIG. 6 is a cross-sectional view illustrating the method of manufacturing the semiconductor device shown in FIG. 1.
Figure 7:
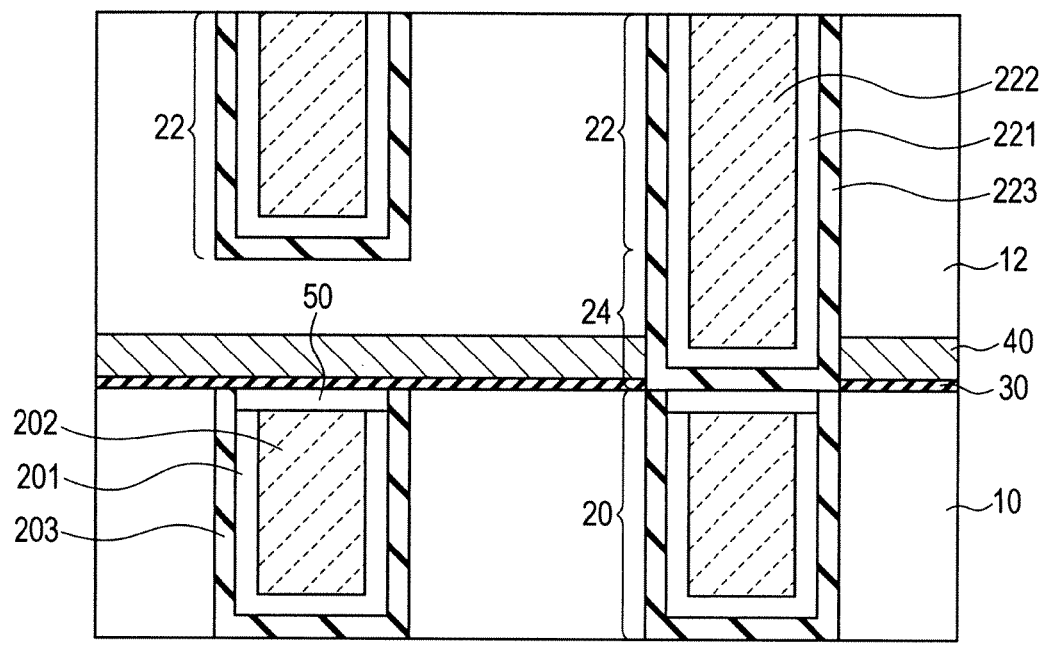
FIG. 7 is a cross-sectional view illustrating the method of manufacturing the semiconductor device shown in FIG. 1.

Next, as shown in FIG. 6, etching is performed to form an opening 62 in the interlayer insulating film 12 by using the hard mask 60 as a mask. In this etching process, the etching stopper film 40 and SiN film 30 in the opening 64 are etched to expose the upper surface of the wiring 20. Next, as shown in FIG. 7, the hard mask 60 is removed to form the wiring 22 within the opening 62. Further, the via 24 and the wiring 22 are formed within the opening 64. The process of forming the via 24 and the wiring 22 is the same as the process of forming the wiring 20 and performed, for instance, by the dual damascene method.

Figure 8:
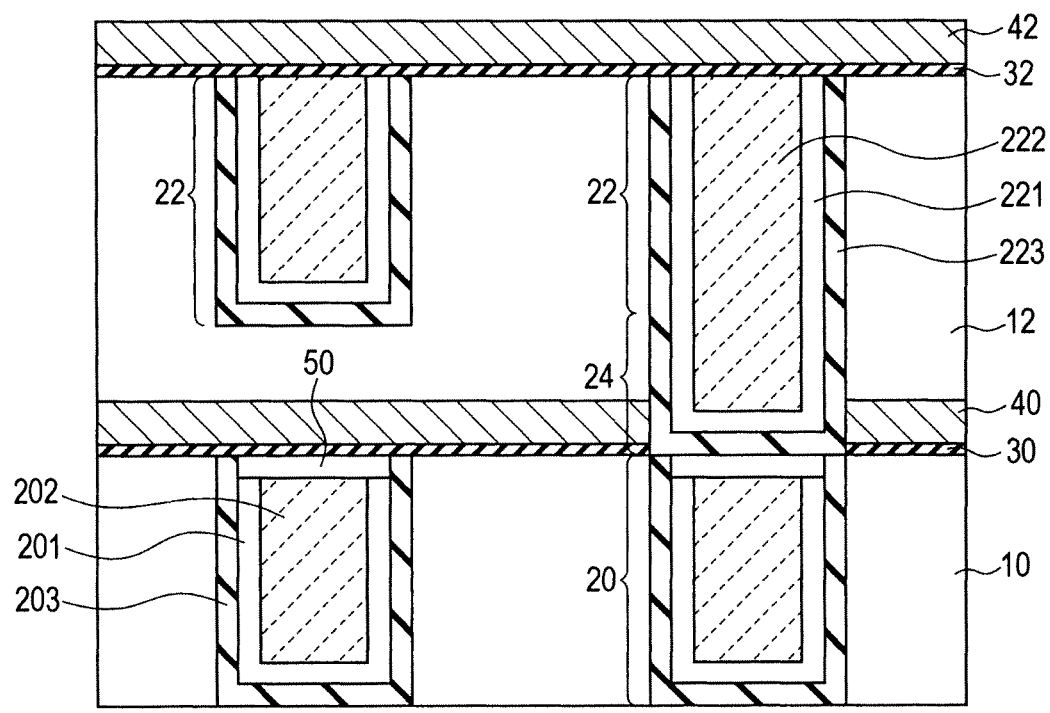
FIG. 8 is a cross-sectional view illustrating the method of manufacturing the semiconductor device shown in FIG. 1.

Next, as shown in FIG. 8, the SiN film 32 and the etching stopper film 42 are stacked, in the order named, over the interlayer insulating film 12 and over the wiring 22. The process shown in FIG. 8 is the same as the process of forming the SiN film 30 and the etching stopper film 40. Subsequently, the processes shown in FIGS. 4 to 8 are repeatedly performed to form the semiconductor device 100 having a multilayer wiring structure.

Advantages of the present embodiment will now be described. The inventors of the present invention have found that current leakage occurs in the SiN film included in the barrier insulating film due to Si—H bonds and dangling bonds possessed by the SiN film when the technology described in Japanese Patent Application Publication No. 2009-182000 is used. According to the present embodiment, however, the peak positions of Si—H bonds of the SiN film 30, which are measured by FTIR, are within the range of 845 $cm^{-1}$ to 860 $cm^{-1}$. It indicates that the Si—H bonds and dangling bonds are decreased in number. As described above, the SiN film 30 according to the present embodiment is such that the Si—H bonds and dangling bonds are decreased in number. Therefore, the current leakage in the SiN film can be inhibited.

Further, according to the present embodiment, the composition ratio of N/Si in the SiN film 30, which is measured by XPS, is within the range of 0.9 to 4/3. Furthermore, the spin density due to the dangling bonds in the SiN film 30 is not higher than 1E17 $spins/cm^3$. These measurements indicate that the Si—H bonds and dangling bonds in the SiN film are decreased in number. As described above, the SiN film 30 according to the present embodiment can inhibit current leakage in it because the Si—H bonds and dangling bonds are small in number.

Current leakage in the SiN film is evident particularly when its thickness is not more than 5 nm. The reason is that good film quality is not obtained as plasma is applied to the SiN film for a short period of time during a SiN film formation process. According to the present embodiment, however, the nitridation plasma process is performed on the SiN film 30 after it is formed. Therefore, the SiN film 30 having good film quality can be obtained. This makes it possible to inhibit current leakage in the SiN film.

According to the technology described in Japanese Patent Application Publication No. 2009-182000, there is a barrier insulating film that includes a SiCN film and a SiCO film and is disposed between interlayer insulating films. The SiCN film has a relative dielectric constant of 4.8, whereas the SiCO film has a relative dielectric constant of 4.5. Meanwhile, according to the present embodiment, the enhanced nitridation process is performed on the SiN film 30 to decrease the Si—H bonds and dangling bonds in number. Thus, a film exhibiting high barrier performance is obtained. Hence, the etching stopper film 40 formed over the SiN film 30 does not have to exhibit good barrier performance. Therefore, the etching stopper film 40 having a relative dielectric constant of 4 or less may be used. As described above, the effective dielectric constant of an insulating film between the interlayer insulating films can be decreased.

When the barrier insulating film absorbs water, the EM (eletromigration) characteristics and SIV (stress-induced voiding) resistance of a semiconductor device deteriorate. The reason is that the water permeating through the barrier insulating film oxidizes the surface of wiring and stresses the barrier insulating film. When the surface of wiring is oxidized, the metal material of the wiring readily ionizes. This facilitates the movement of metal ions in an electric field between wires, thereby deteriorating the TDDB characteristics. Meanwhile, if the thickness of the barrier insulating film is increased to prevent such deterioration, the effective dielectric constant increases. According to the present embodiment, however, the SiN film 30 having low water permeability is used as the barrier insulating film to prevent the wiring 20 and interlayer insulating film 10 from absorbing water. This makes it possible to inhibit the surface of the wiring 20 from being oxidized by water. In addition, the stress applied to the SiN film 30, which is a barrier insulating film, can be stabilized. Consequently, the thickness of the barrier insulating film can be decreased while inhibiting the EM characteristics and TDDB characteristics from deteriorating.

If the wiring is formed by an alloy containing the added metal, the added metal is segregated in the surface of the wiring to oxidize the added metal segregation layer. This makes it possible to inhibit the wiring from being oxidized. However, as the barrier insulating film absorbs water, oxygen enters the grain boundary of the wiring. As the incoming oxygen blocks the movement of the added metal, the formation of the added metal segregation layer is inhibited. According to the present embodiment, however, the SiN film 30 is used as the barrier insulating film to prevent the moisture absorption of the barrier insulating film and inhibit the entry of oxygen. Therefore, the added metal segregation layer 50 can be formed steadily. This makes it possible to inhibit the deterioration of the EM characteristics and SIV characteristics and improve the reliability of the semiconductor device.

Further, performing the enhanced nitridation process on the SiN film 30 makes it possible to obtain a high-density film having a decreased number of dangling bonds. Thus, the water permeability of the SiN film can be reduced to inhibit water from entering the wiring 20. Therefore, the introduction of oxygen into the grain boundary in the wiring can be inhibited to form the added metal segregation layer 50 with increased stability. Consequently, the deterioration of the EM characteristics and SIV characteristics can be inhibited to improve the reliability of the semiconductor device.

When the enhanced nitridation process is performed, the SiN film 30 functions as a buffer. In the interlayer insulating film 10, therefore, nitrogen is segregated in the upper layer only. This not only inhibits the interlayer insulating film from being excessively nitrided to increase the dielectric constant and from being damaged, but also improves the TDDB characteristics. Further, in the wiring 20, nitrogen is also segregated in the upper layer only. This prevents the surface of the wiring from being oxidized. Consequently, the reliability of the semiconductor device can be improved.

As described above, the present embodiment makes it possible to provide a semiconductor device with a highly reliable barrier insulating film having a low effective dielectric constant.

First Embodiment

Figure 10:
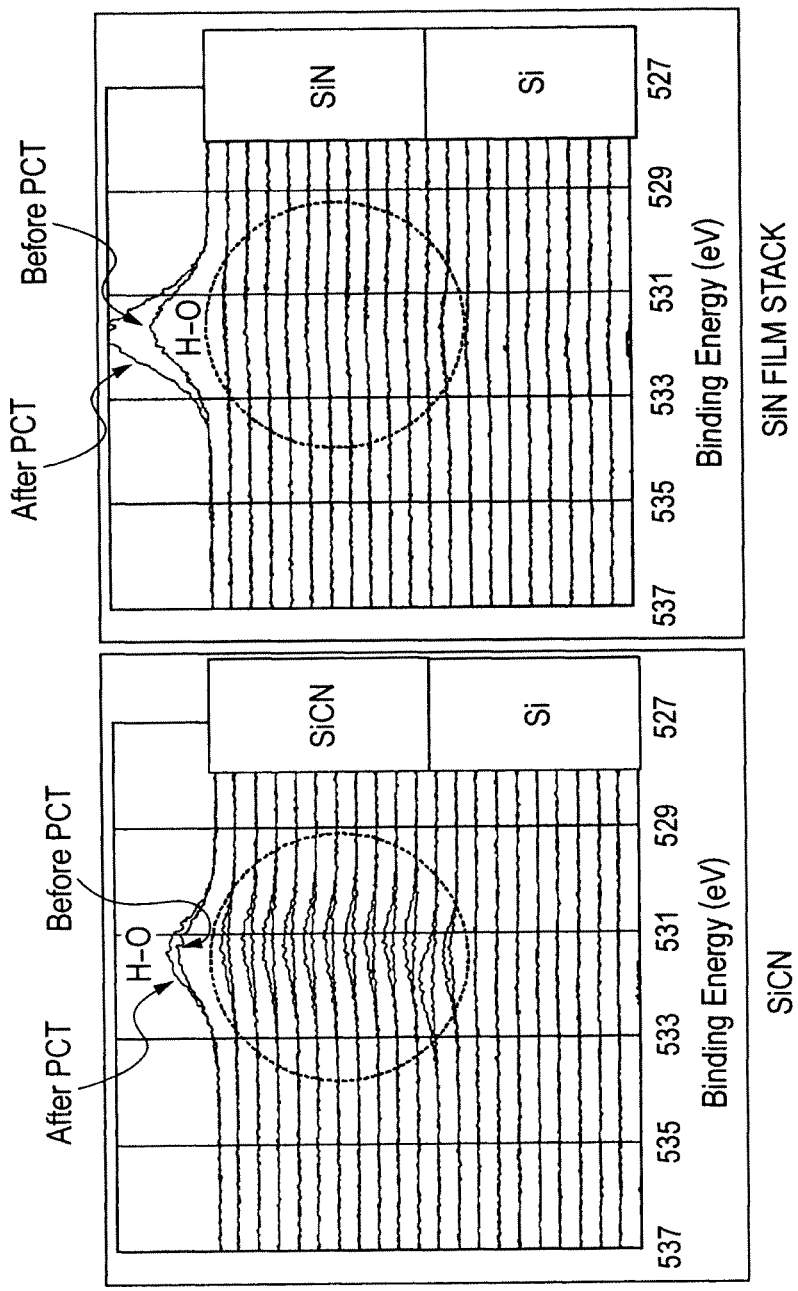
FIG. 10 shows graphs illustrating the XPS depth profiles of oxygen 1s of the semiconductor device according to a first embodiment of the present invention.

FIG. 10 shows graphs illustrating the XPS depth profiles of oxygen 1s of the semiconductor device according to a first embodiment of the present invention. For the first embodiment, a SiCN film (left-hand graph in FIG. 10) and a film stack (right-hand graph in FIG. 10), which was obtained by forming a stack of 33 layers of 3 nm thick film subjected to the nitridation plasma process, were prepared and subjected to a PCT (high-pressure high-humidity test). XPS depth profiles were then used to compare film quality prevailing before the PCT against film quality prevailing after the PCT. The SiCN film was a blanket film having a thickness of 100 nm. The film stack containing the multiple layers of SiN film had a thickness of 100 nm. The PCT was conducted at a temperature of 125° C., at a humidity of 100%, at an atmospheric pressure of 110 kPa, and for a period of 24 hours.

FIG. 10 shows profiles about various depths that were obtained before and after the PCT. In the left-hand half of FIG. 10, profiles having visible peaks within a circled portion of profiles about various depths were obtained after the PCT, whereas profiles having no visible peaks were obtained before the PCT. As indicated by the left-hand half of FIG. 10, the peaks of H—O bonds in the SiCN film were visible after the PCT. It means that the amount of oxygen in the SiCN film is increased. In the right-hand half of FIG. 10, on the other hand, the profiles within a portion of profiles that is circled in the same manner as for the left-hand half are substantially identical with each other. The right-hand half of FIG. 10 indicates that the peaks of H—O bonds are not visible in the film stack containing the SiN film subjected to the nitridation plasma process. It means that the amount of oxygen in the film stack is not increased. As is obvious from the above, the film stack containing the SiN film subjected to the nitridation plasma process exhibits consistent film quality even in a highly humid atmosphere, and the stress applied to the film stack does not significantly change.

Second Embodiment

Figure 11:
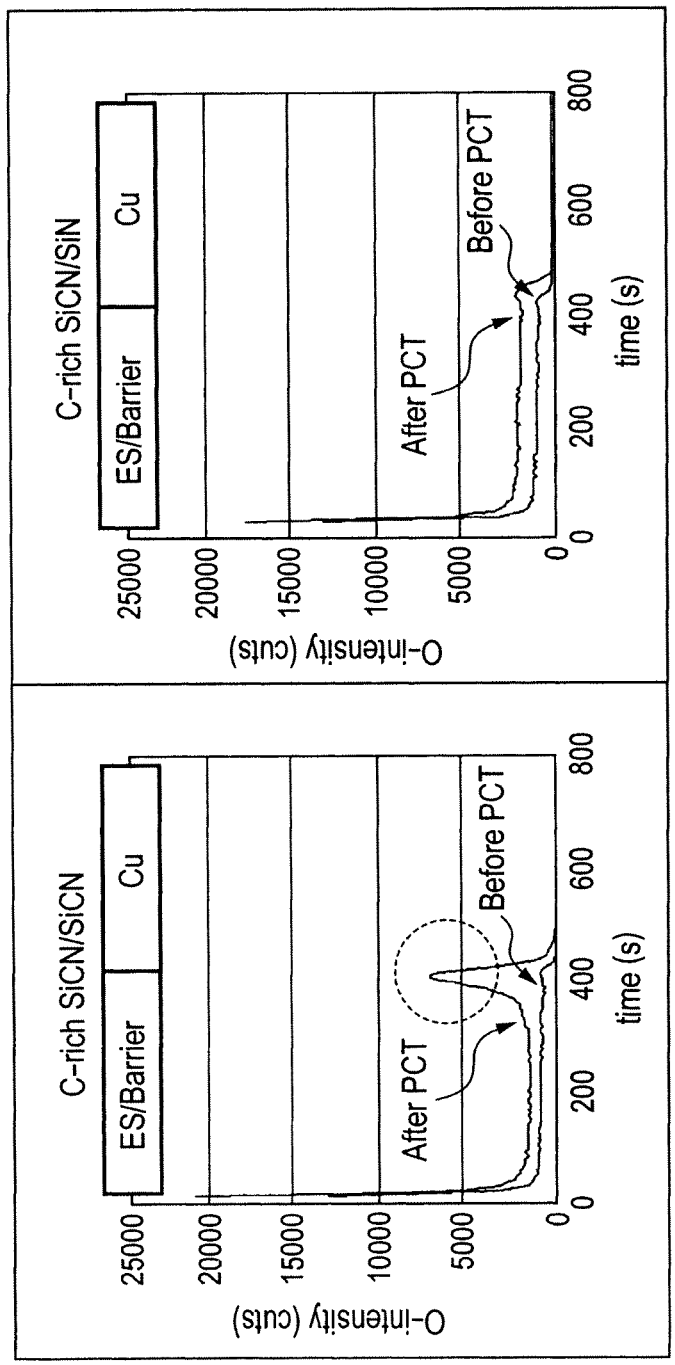
FIG. 11 shows graphs illustrating the TOF-SIMS depth profiles of the semiconductor device according to a second embodiment of the present invention.

FIG. 11 shows graphs illustrating the TOF-SIMS depth profiles of the semiconductor device according to a second embodiment of the present invention. For the second embodiment, the barrier insulating film and etching stopper film were formed over wiring made of a Cu alloy seed film and pure Cu plating film. The resulting structure was then subjected to a PCT. TOF-SIMS depth profiles were used to compare oxygen-derived signal intensity ($O^-$ intensity) prevailing before the PCT against oxygen-derived signal intensity ($O^-$ intensity) prevailing after the PCT. The PCT was conducted under the same measurement conditions as for the first embodiment.

The left-hand half of FIG. 11 depicts a case where a C-rich SiCN film and a SiCN film were used as the etching stopper film and barrier insulating film, respectively. The C-rich SiCN film had a thickness of 35 nm, whereas the SiCN film had a thickness of 10 nm. The upper curve in the left-hand half of FIG. 11 shows a profile obtained after the PCT, whereas the lower curve shows a profile obtained before the PCT. The right-hand half of FIG. 11 depicts a case where a C-rich SiCN film and a SiN film were used as the etching stopper film and barrier insulating film, respectively. The C-rich SiCN film had a thickness of 42 nm, whereas the SiN film had a thickness of 3 nm. The SiN film was subjected to the nitridation plasma process after it was formed. The upper curve in the right-hand half of FIG. 11 shows a profile obtained after the PCT, whereas the lower curve shows a profile obtained before the PCT.

As is obvious from the left-hand half of FIG. 11, the oxygen-derived signal intensity is increased at the boundary between the barrier insulating film and Cu wiring when the SiCN film is used as the barrier insulating film. When, on the other hand, the SiN film subjected to the nitridation plasma process is used as the barrier insulating film, the oxygen-derived signal intensity is not increased at the boundary between the barrier insulating film and Cu wiring, as shown in the right-hand half of FIG. 11. As described above, when the SiN film subjected to the nitridation plasma process is used as the barrier insulating film, the water permeability of the barrier insulating film is reduced to inhibit oxygen from entering the wiring.

Third Embodiment

For a third embodiment of the present invention, the EM characteristics, TDDB characteristics, and SIV characteristics of the two structures used in connection with the second embodiment were measured. Measurements of the EM characteristics indicate that when the SiN film subjected to the nitridation plasma process was used as the barrier insulating film, the useful life indicated by MTTF (mean time to failure) was five times longer than when the SiCN film was used as the barrier insulating film. Measurements of the TDDB characteristics indicate that when the SiN film subjected to the nitridation plasma process was used as the barrier insulating film, the useful life indicated by MTTF was fifty times longer than when the SiCN film was used as the barrier insulating film. Measurements of the SiV characteristics were made to check for faults between 66 nm to 3 μm upper and lower wiring layers while the temperature was held at 175° C. Faults were found when the SiCN film was used as the barrier insulating film. When, on the other hand, the SiN film subjected to the nitridation plasma process was used as the barrier insulating film, no fault was encountered even after the elapse of 100 hours.

Fourth Embodiment

For a fourth embodiment of the present invention, two film stacks were obtained by forming a stack of 33 layers of 3 nm thick SiN film. One film stack was subjected to the nitridation plasma process, whereas the other film stack was not subjected to the nitridation plasma process. These two film stacks were measured to determine the current density-voltage characteristics of the SiN film. Further, the peak positions of Si—N bonds of the SiN film were measured by FTIR.

Figure 12:
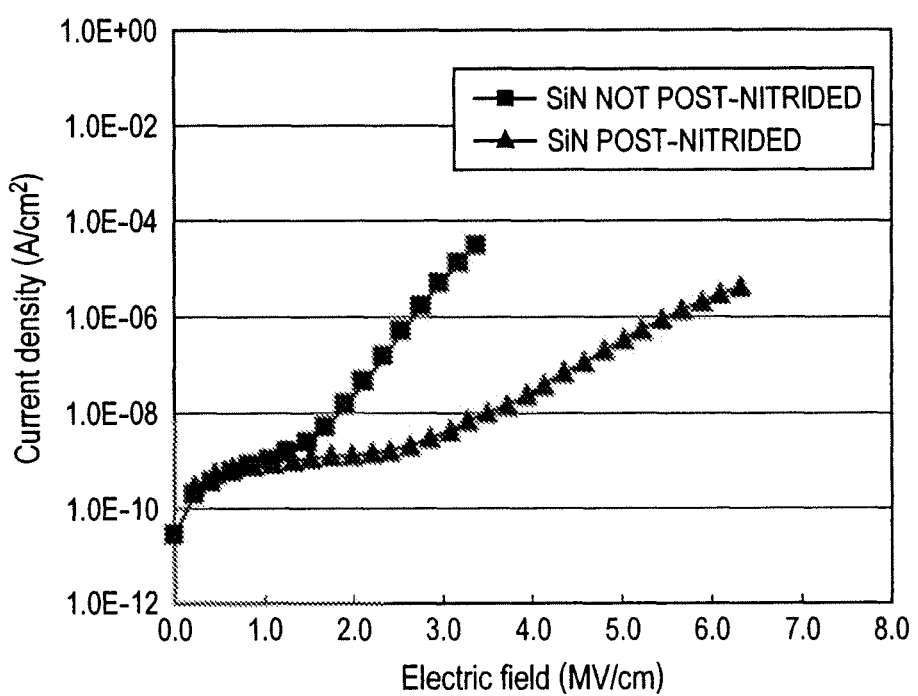
FIG. 12 is a graph illustrating the current density-voltage characteristics of a SiN film according to a fourth embodiment of the present invention.

FIG. 12 is a graph illustrating the current density-voltage characteristics of the SiN film according to the fourth embodiment. As shown in FIG. 12, the current leakage in the SiN film was reduced by the nitridation plasma process. The amount of current leakage was smaller when the nitridation plasma process was performed than when it was not performed. More specifically, when the nitridation plasma process was performed, the amount of current leakage was two orders of magnitude smaller at 3 MV/cm than when the nitridation plasma process was not performed.

Figure 13:
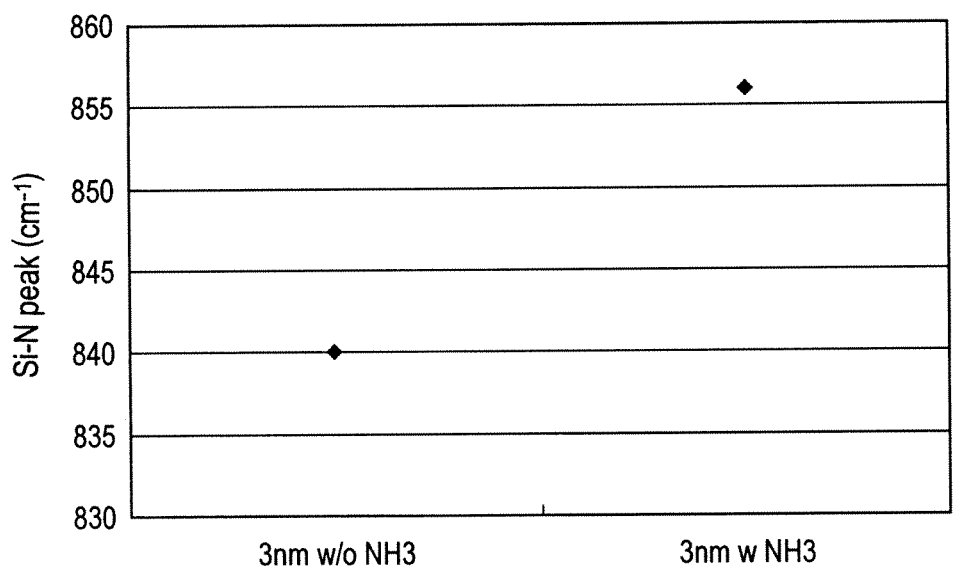
FIG. 13 is a graph illustrating the peak positions of Si—N bonds of the SiN film according to the fourth embodiment of the present invention, which are measured by FTIR.

FIG. 13 is a graph illustrating the peak positions of Si—N bonds of the SiN film according to the fourth embodiment, which were measured by FTIR. As shown in FIG. 13, the peak position of Si—N bonds was 840 $cm^{-1}$ when the nitridation plasma process was not performed. When, on the other hand, the nitridation plasma process was performed, the peak position of Si—N bonds was 856 $cm^{-1}$. These measurement results indicate that the Si—H bonds and dangling bonds were decreased in number when the nitridation plasma process was performed. It is assumed that the peak position is 860 $cm^{-1}$ when ideal $Si_3N_4$ is used. It is therefore estimated that the nitridation plasma process provides good film quality. An ESR analysis of the SiN film revealed that the spin density due to the dangling bonds was 5.8E17 spins/cm$^3$ when the nitridation plasma process was not performed. When, on the other hand, the nitridation plasma process was performed, the spin density due to the dangling bonds was not higher than 1E17 spins/cm$^3$, which represents the limit of detection.

Fifth Embodiment

Figure 14:
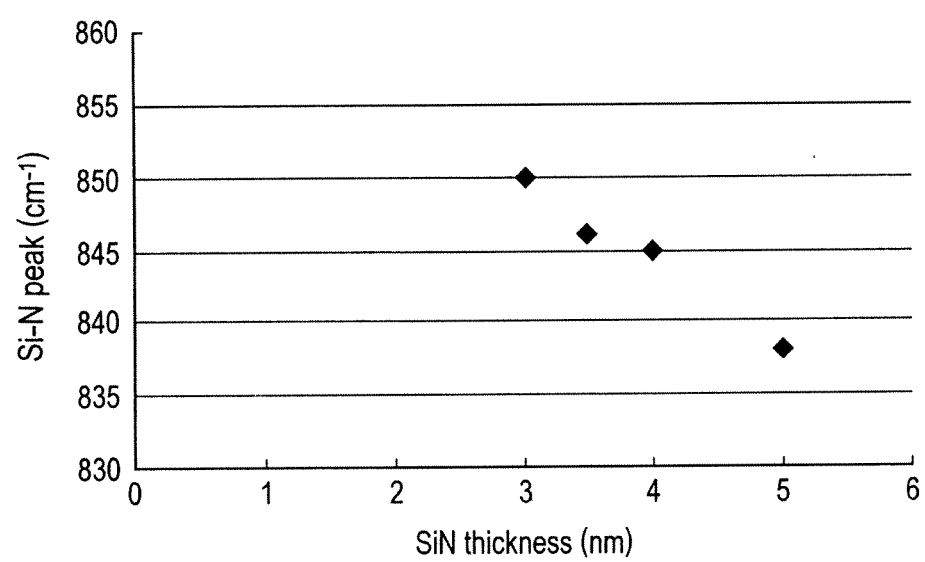
FIG. 14 is a graph illustrating the peak positions of Si—N bonds of the SiN film according to a fifth embodiment of the present invention, which are measured by FTIR.

FIG. 14 is a graph illustrating the peak positions of Si—N bonds of the SiN film according to a fifth embodiment of the present invention, which was measured by FTIR. For the fifth embodiment, the peak positions of Si—N bonds were measured when the SiN film subjected to the nitridation plasma process had a thickness of 3 to 5 nm. As shown in FIG. 14, the number of waves indicative of peaks of Si—N bonds decreased with an increase in the thickness of the SiN film. More specifically, the peak position was 850 cm$^{-1}$ when the SiN film thickness was 3 nm, 846 cm$^{-1}$ when the SiN film thickness was 3.5 nm, 845 cm$^{-1}$ when the SiN film thickness was 4 nm, and 838 cm$^{-1}$ when the SiN film thickness was 5 nm. It means that the Si—H bonds and dangling bonds in the SiN film increase in number when the film thickness increases. The maximum permissible film thickness for devices is 4 nm. The peak position of Si—N bonds that corresponds to a film thickness of 4 nm is 845 cm$^{-1}$.

As described above, the present invention makes it possible to provide a highly reliable semiconductor device.

Although specific embodiments have been described with reference to the accompanying drawings, they are merely described as illustrative examples of the present invention. Those skilled in the art will readily appreciate that various modifications and changes can be applied to the embodiments without departing from the scope and spirit of the present invention as defined in the appended claims.

What is claimed is:

1. A semiconductor device, comprising:
   a first interlayer insulating film;
   a wiring provided in the first interlayer insulating film; and
   an Si-and-N-contained insulating film provided over the first interlayer insulating film and over the wiring,
   wherein the peak positions of Si—N bonds of the Si-and-N-contained insulating film, which are measured by FTIR (Fourier transform infrared spectroscopy), are within a range of 845 cm$^{-1}$ to 860 cm$^{-1}$,
   wherein an upper surface of the first interlayer insulating film is flush with an upper surface of the wiring,
   wherein the wiring comprises:
      a plating film;
      a seed film disposed on side surfaces and a bottom surface of the plating film;
      a barrier metal film disposed on side surfaces and a bottom surface of the seed film; and
      a segregated layer disposed on an upper surface of the plating film and an upper surface of the seed film, and
   wherein the Si-and-N-contained insulating film is disposed on an upper surface of the segregated layer and an upper surface of the barrier metal film.

2. A semiconductor device according to claim 1, wherein the Si-and-N-contained insulating film comprises an SiN film.

3. The semiconductor device according to claim 1, wherein the wiring comprises Cu and an added metal comprising Al, Mn, Ti, Sn, Mg, Si, or Zr, and includes the segregated layer that is obtained when the added metal is segregated in a plane in contact with the Si-and-N-contained insulating film.

4. The semiconductor device according to claim 1, wherein the Si-and-N-contained insulating film has a thickness of 1 nm to 4 nm.

5. The semiconductor device according to claim 1, wherein an upper surface of the Si-and-N-contained insulating film has a higher nitrogen concentration than another portion of the SiN film.

6. The semiconductor device according to claim 1, wherein lateral and lower surfaces of the wiring are covered with the barrier metal film, and
   wherein a hydrogen concentration of a boundary between the wiring and the barrier metal film is higher than a hydrogen concentration of another portion of the wiring.

7. The semiconductor device according to claim 1, further comprising:
   an etching stopper film provided over the Si-and-N-contained insulating film; and
   a second interlayer insulating film provided over the etching stopper film;
   wherein the etching stopper film has a lower etching rate than the second interlayer insulating film when the second interlayer insulating film is etched.

8. The semiconductor device according to claim 7, wherein the etching stopper film includes at least one of SiCN (SiCNH), SiCO (SiCOH), SiCNO (SiCNOH), SiC (SiCH), SiB (SiBH), SiBN (SiBHN), SiBC (SiBCH), SiBCN (SiBCNH), C-rich SiCN (SiCNH), C-rich SiCO (SiCOH), C-rich SiCNO (SiCNOH), C-rich SiC (SiCH), C-rich SiBC (SiBCH), and C-rich SiBCN (SiBCHN).

9. The semiconductor device according to claim 7, wherein the etching stopper film has a relative dielectric constant of 4 or less.

10. A semiconductor device, comprising:
    a first interlayer insulating film;
    a wiring provided in the first interlayer insulating film; and
    an Si-and-N-contained insulating film provided over the first interlayer insulating film and over the wiring,
    wherein a composition ratio N/Si of the Si-and-N-contained insulating film, which is measured by XPS (X-ray photoemission spectroscopy), is within a range from 0.9 to 4/3,
    wherein the wiring comprises:
       a plating film;
       a seed film disposed on side surfaces and a bottom surface of the plating film;
       a barrier metal film disposed on side surfaces and a bottom surface of the seed film; and
       a segregated layer disposed on an upper surface of the plating film and an upper surface of the seed film, and
    wherein the Si-and-N-contained insulating film is disposed on an upper surface of the segregated layer and an upper surface of the barrier metal film.

11. A semiconductor device according to claim 10, wherein the Si-and-N-contained insulating film comprises an SiN film.

12. The semiconductor device according to claim 10, wherein the wiring comprises Cu and an added metal comprising Al, Mn, Ti, Sn, Mg, Si, or Zr, and includes the segregated layer that is obtained when the added metal is segregated in a plane in contact with the Si-and-N-contained insulating film.

13. The semiconductor device according to claim 10, wherein the Si-and-N-contained insulating film has a thickness of 1 nm to 4 nm.

14. The semiconductor device according to claim 10, wherein an upper surface of the Si-and-N-contained insulating film has a higher nitrogen concentration than another portion of the SiN film.

15. The semiconductor device according to claim 10, wherein lateral and lower surfaces of the wiring are covered with the barrier metal film, and
wherein a hydrogen concentration of a boundary between the wiring and the barrier metal film is higher than a hydrogen concentration of another portion of the wiring.

16. The semiconductor device according to claim 10, further comprising:
an etching stopper film provided over the Si-and-N-contained insulating film; and
a second interlayer insulating film provided over the etching stopper film,
wherein the etching stopper film has a lower etching rate than the second interlayer insulating film when the second interlayer insulating film is etched.

17. The semiconductor device according to claim 16, wherein the etching stopper film includes at least one of SiCN (SiCNH), SiCO (SiCOH), SiCNO (SiCNOH), SiC (SiCH), SiB (SiBH), SiBN (SiBHN), SiBC (SiBCH), SiBCN (SiBCNH), C-rich SiCN (SiCNH), C-rich SiCO (SiCOH), C-rich SiCNO (SiCNOH), C-rich SiC (SiCH), C-rich SiBC (SiBCH), and C-rich SiBCN (SiBCHN).

18. The semiconductor device according to claim 16, wherein the etching stopper film has a relative dielectric constant of 4 or less.

19. A semiconductor device, comprising:
a first interlayer insulating film;
a wiring provided in the first interlayer insulating film; and
an Si-and-N-contained insulating film provided over the first interlayer insulating film and over the wiring,
wherein a spin density due to a dangling bond in the Si-and-N-contained insulating film is 1E17 spins/cm$^3$ or less,
wherein the wiring comprises:
a plating film;
a seed film disposed on side surfaces and a bottom surface of the plating film;
a barrier metal film disposed on side surfaces and a bottom surface of the seed film; and
a segregated layer disposed on an upper surface of the plating film and an upper surface of the seed film, and
wherein the Si-and-N-contained insulating film is disposed on an upper surface of the segregated layer and an upper surface of the barrier metal film.

20. A semiconductor device according to claim 19, wherein the Si-and-N-contained insulating film comprises an SiN film.

21. The semiconductor device according to claim 19, wherein the wiring comprises Cu and added metal comprising Al, Mn, Ti, Sn, Mg, Si, or Zr, and includes the segregated layer that is obtained when the added metal is segregated in a plane in contact with the Si-and-N-contained insulating film.

22. The semiconductor device according to claim 19, wherein the Si-and-N-contained insulating film has a thickness of 1 nm to 4 nm.

23. The semiconductor device according to claim 19, wherein an upper surface of the Si-and-N-contained insulating film has a higher nitrogen concentration than another portion of the SiN film.

24. The semiconductor device according to claim 19, wherein lateral and lower surfaces of the wiring are covered with the barrier metal film, and
wherein a hydrogen concentration of a boundary between the wiring and the barrier metal film is higher than a hydrogen concentration of another portion of the wiring.

25. The semiconductor device according to claim 19, further comprising:
an etching stopper film provided over the Si-and-N-contained insulating film; and
a second interlayer insulating film provided over the etching stopper film;
wherein the etching stopper film has a lower etching rate than the second interlayer insulating film when the second interlayer insulating film is etched.

26. The semiconductor device according to claim 25, wherein the etching stopper film includes at least one of SiCN (SiCNH), SiCO (SiCOH), SiCNO (SiCNOH), SiC (SiCH), SiB (SiBH), SiBN (SiBHN), SiBC (SiBCH), SiBCN (SiBCNH), C-rich SiCN (SiCNH), C-rich SiCO (SiCOH), C-rich SiCNO (SiCNOH), C-rich SiC (SiCH), C-rich SiBC (SiBCH), and C-rich SiBCN (SiBCHN).

27. The semiconductor device according to claim 25, wherein the etching stopper film has a relative dielectric constant of 4 or less.

28. A semiconductor device according to claim 1, wherein the wiring extends in the first interlayer insulating film to reach a bottom surface of the first interlayer insulating film.

29. A semiconductor device according to claim 1, wherein the Si-and-N-contained insulating film is disposed on the upper surface of the first interlayer insulating and the upper surface of the wiring.

30. A semiconductor device according to claim 1, wherein the segregated layer is disposed on side surfaces of the barrier metal film.

31. A semiconductor device according to claim 10, wherein an upper surface of the first interlayer insulating film is flush with an upper surface of the wiring.

32. A semiconductor device according to claim 19, wherein an upper surface of the first interlayer insulating film is flush with an upper surface of the wiring.

* * * * *